United States Patent
Wu et al.

(10) Patent No.: US 11,495,729 B2
(45) Date of Patent: Nov. 8, 2022

(54) DEFORMABLE HETEROSTRUCTURES, ELECTRONIC DEVICES INCORPORATING THE SAME, AND METHODS OF MAKING THE SAME

(71) Applicant: Purdue Research Foundation, West Lafayette, IN (US)

(72) Inventors: Wenzhuo Wu, West Lafayette, IN (US); Ruoxing Wang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 1008 days.

(21) Appl. No.: 16/181,603

(22) Filed: Nov. 6, 2018

(65) Prior Publication Data
US 2019/0140159 A1    May 9, 2019

Related U.S. Application Data

(60) Provisional application No. 62/582,155, filed on Nov. 6, 2017.

(51) Int. Cl.
| | |
|---|---|
| *H01L 41/08* | (2006.01) |
| *H01L 41/18* | (2006.01) |
| *H01L 41/047* | (2006.01) |
| *H01L 41/29* | (2013.01) |
| *H01L 41/113* | (2006.01) |
| *H01L 41/31* | (2013.01) |

(52) U.S. Cl.
CPC ...... *H01L 41/0805* (2013.01); *H01L 41/0472* (2013.01); *H01L 41/0477* (2013.01); *H01L 41/113* (2013.01); *H01L 41/18* (2013.01); *H01L 41/29* (2013.01); *H01L 41/31* (2013.01)

(58) Field of Classification Search
CPC .. H01L 41/0805; H01L 41/18; H01L 41/0477
See application file for complete search history.

(56) References Cited

U.S. PATENT DOCUMENTS

| | | | |
|---|---|---|---|
| 2006/0038290 A1* | 2/2006 | Tavkhelidze | H01J 9/02 |
| | | | 257/781 |
| 2007/0037365 A1* | 2/2007 | Ranganath | B82Y 10/00 |
| | | | 438/478 |
| 2013/0260113 A1* | 10/2013 | Hart | B32B 3/22 |
| | | | 428/201 |

(Continued)

OTHER PUBLICATIONS

M. D. Dickey et al., "Eutectic Gallium-Indium (EGaIn): A Liquid Metal Alloy for the Formation of Stable Structures in Microchannels at Room Temperature", Adv. Funct. Mater. (2008), 18, 1097-1104.

(Continued)

*Primary Examiner* — Bryan P Gordon
(74) *Attorney, Agent, or Firm* — Hartman Global IP Law; Gary M. Hartman; Domenica N. S. Hartman

(57) ABSTRACT

Highly deformable heterostructures utilizing liquid metals and nanostructures that are suitable for various applications, including but not limited to stretchable electronic devices that can be worn, for example, by a human being. Such a deformable heterostructure includes a stretchable substrate, a conductive liquid metal on the substrate, and nanostructures forming a solid-liquid heterojunction with the conductive liquid metal.

15 Claims, 16 Drawing Sheets

(56) References Cited

U.S. PATENT DOCUMENTS

2014/0007687 A1* 1/2014 Wang .................. H02N 2/181
                                                    73/488
2016/0145305 A1* 5/2016 Tovar ................ C07K 5/06052
                                                    530/329
2016/0284971 A1* 9/2016 Hong .................. H01L 41/047

OTHER PUBLICATIONS

Y. Zhou et al., "Low-Temperature Growth of Two-Dimensional Layered Chalcogenide Crystals on Liquid", Nano Lett. 2016, 16, 2103-2107.
L. Wang, et al., "Piezoelectric Nanogenerators Based on Zinc Oxide Nanowire Arrays", Science, vol. 312 Apr. 14, 2006.
J. W. Boley, et al., "Direct Writing of Gallium-Indium Alloy for Stretchable Electronics", Adv. Funct. Mater. 2014, 24, 3501-3507.
M. K. Gupta et al., "Two-Dimensional Vanadium-Doped ZnO Nanosheet-Based Flexible Direct Current Nanogenerator", www.acsnano.org., vol. 7 ' No. 10 ' 8932-8939 ' 2013.
J. Park et al., "Fingertip Skin-Inspired Microstructured Ferroelectric Skins Discriminate Static/dynamic Pressure and Temperature Stimuli", Nanomaterials, Sci. Adv. 2015;1:e1500661.
K. Takei, et al., "Nanowire Active-Matrix Circuitry for Low-Voltage Macroscale Artificial Skin", Nature Materials vol. 9, Oct. 2010, www.nature.com/naturematerials.

* cited by examiner

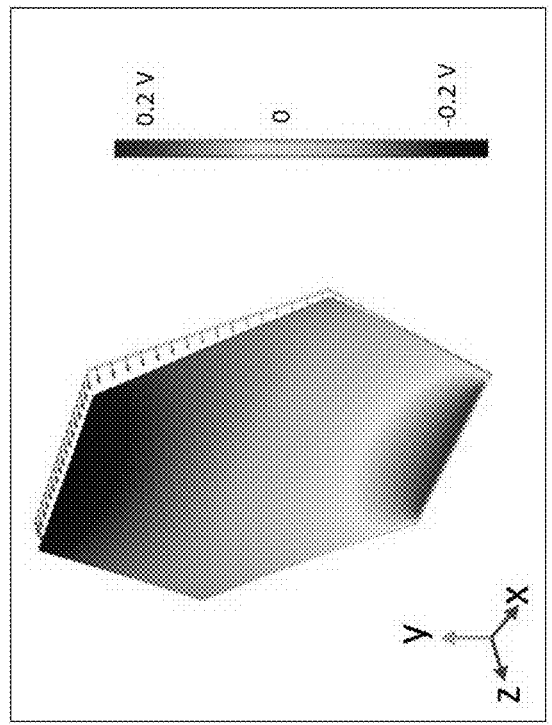
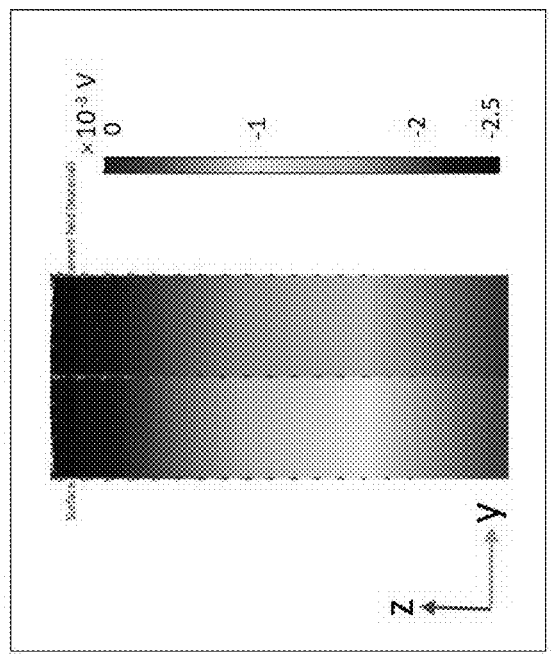
FIG. 3B

DEFORMABLE HETEROSTRUCTURES, ELECTRONIC DEVICES INCORPORATING THE SAME, AND METHODS OF MAKING THE SAME

CROSS REFERENCE TO RELATED APPLICATIONS

This application claims the benefit of U.S. Provisional Application No. 62/582,155, filed Nov. 6, 2017, the contents of which are incorporated herein by reference.

TECHNICAL FIELD

The present application relates to highly deformable heterostructures, including electronic devices that incorporate deformable heterostructures, and methods of making the same.

BACKGROUND

State-of-the-art electronics are based on planar and rigid structures, limiting their integration with three-dimensional soft biological systems. Mechanically deformable devices incorporating liquid components present an ideal platform for enabling the conformal coverage of electronics on curved and soft surfaces in related applications. Mechanically deformable electronic devices incorporating the electrically conductive fluid metal eutectic of gallium and indium (EGaIn, by weight 75% Ga and 25% In) present a particularly notable platform for stretchable conductors and sensors. A benefit from its metallicity and low melting point (15.5° C.) is that EGaIn is liquid and hence printable at room temperature while maintaining its electrical conductivity.

Heterogeneous interfaces between functional materials are central constituents in state-of-the-art electronic and optoelectronic devices. However, liquid-based electronic devices have been limited to merely incorporating liquid components as passive electrodes given the difficulty in the fabrication of liquid-based heterojunctions. Moreover, there is a lack of the fundamental understanding and technological capability of monolithically integrating liquid structures (for example, electrodes) with functional materials, in particular, inorganic semiconductors that offer desired electronic and optoelectronic properties in applications such as three-dimensional soft biological systems.

Two-dimensional (2D) GaSe crystals have been grown on surfaces of liquid metals at low temperature. However, the as-synthesized nanocrystals were transferred to other substrates for further application. The stretchability and conductivity of the liquid metal were not utilized.

BRIEF DESCRIPTION OF THE INVENTION

The present invention provides highly deformable heterostructures utilizing liquid metals and nanostructures that are suitable for various applications, including but not limited to stretchable electronic devices that can be worn, for example, by a human being.

According to one aspect of the invention, a deformable heterostructure comprises a stretchable substrate, a conductive liquid metal on the substrate, and nanostructures forming a solid-liquid heterojunction with the conductive liquid metal.

According to another aspect of the invention, an electronic device includes a substrate, a conductive liquid electrode on the substrate, and a sensing element comprising a piezoelectric material on the conductive liquid electrode forming a solid-liquid heterojunction between the piezoelectric material and the conductive liquid electrode. A charge differential is created in the piezoelectric material in response to a mechanical strain.

According to yet another aspect of the invention, a method of making an electronic device includes forming a conductive liquid electrode on a substrate, placing the substrate containing the conductive liquid electrode into a precursor solution containing precursors for growing a piezoelectric material, and heating the precursor solution to grow the piezoelectric material on the conductive liquid electrode as a solid material.

Other aspects and advantages of this invention will be appreciated from the following detailed description.

BRIEF DESCRIPTION OF THE DRAWINGS

Some of the drawings shown herein include dimensions. Further, some of the drawings shown herein may have been created from scaled drawings or from photographs that are scalable. It is understood that such dimensions or the relative scaling within a drawing are by way of example, and not to be construed as limiting.

FIGS. 2H, 2I, 2J, and 2K are XPS spectra of ZnO nanoplates, Zn $2p_{3/2}$, Ga $2p_{3/2}$ and O 1s respectively.

FIG. 3B shows simulation results for the piezoelectric potential (in V) on a ZnO nanowire (left image) and on a ZnO nanoplate (right image).

DETAILED DESCRIPTION

Figure 1F:
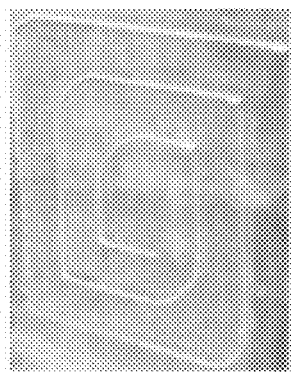
FIGS. 1D through 1F show the liquid metal patterns of FIGS. 1A through 1C, respectively, after being subjected to a growth process.

For the purposes of promoting an understanding of the principles of the disclosure, reference will now be made to the embodiments illustrated in the drawings and specific language will be used to describe the same. It will nevertheless be understood that no limitation of the scope of the disclosure is thereby intended.

In this disclosure, monolithic integration of liquid-solid heterojunction devices that utilize liquid metals and nanostructures is demonstrated through the hybrid manufacturing of self-assembled inorganic semiconductor nanostructures on additively-manufactured liquid electrodes. This presents a significant advancement towards the realization of liquid-solid hybrid functional systems comprising highly deformable heterostructures that have the potential for use in a wide variety of applications, including but not limited to three-dimensional soft biological systems that utilize a stretchable electronic device that can be worn, for example, by a human being. Such wearable devices are preferably conformable to human skin and can sustainably perform non-invasive physiological functions, e.g., cardiovascular monitoring, by harvesting the operation power from the human body. The methods and devices of this disclosure are capable of a positive impact and immediate relevance to many societally pervasive areas, nonlimiting examples of which include biomedical monitoring, consumer electronics, and human-machine interface.

In this disclosure, a platform for the monolithic integration of liquid-solid heterojunction devices is demonstrated with two-dimensional (2D) piezoelectric nanostructures that generate a polarized charge when subjected to mechanical deformation, which charge can then be output to an external circuit by a liquid electrode. Taking advantage of the coupling of piezoelectric and semiconductor properties, ZnO nanostructures have been widely applied, as described in the literature, for converting mechanical deformation into electric power. ZnO tends to form one-dimensional (1D) nanostructures because of the activated (0001) plane leading to the growth along the c-axis. The facile synthesis method of ZnO nanowires promotes the deep exploration of principle. However, the mechanism of vertically aligned 2D ZnO nanostructures is still poorly understood. For 2D ZnO nanostructures, for example, nanoplates and nanosheets (nanoplates with extended lateral dimensions, e.g., in a size range of 1 nanometer to 100 micrometers), the exposed basal plane shows interesting optical and photocatalytic activities. In addition, as the lateral dimensions of the nanostructure increases, a decrease of 63% in Young's modulus was observed for the [0001] direction. The higher deformability indicates a greater piezo-potential can be produced by the 2D nanostructure. In studies leading to the disclosure, piezo-potential simulation was performed for both 1D and 2D ZnO nanostructures by using COMSOL Multiphysics® simulation software (Comsol, Inc.). According to the results (FIGS. 3A through 3F), the 2D form of ZnO nanostructures was better for the piezoelectric sensing than typical 1D ZnO nanowires with aspect ratios of 10. In order to obtain such interesting aligned 2D nanostructures, it was recognized that an electrode-assisted hydrothermal method for 2D ZnO nanosheet growth was needed that would not cause any damage to the electrode.

In experiments leading to this disclosure, a one-step direct-write patterning method was achieved by pumping the eutectic alloy of gallium and indium (EGaIn) through a fixed syringe nozzle of a direct writing system to a moving substrate. At room temperature, EGaIn is liquid and exhibits metallic conductivity and low toxicity. The formation of a gallium oxide (about 1 nm) "skin" upon exposure to air allows the written pattern to maintain its printed shape, even through the elastomer encapsulation process. In the experiments, several substrate types with different mechanical properties were utilized, including rigid (e.g., silicon wafers), flexible, and stretchable platforms. FIGS. 1A through 1C show three printed patterns formed by liquid metal lines (wires) of EGaIn printed on different substrates. The liquid metal lines were extruded from a syringe needle onto bare surfaces of substrates controlled by two motorized stages. The diameters of the lines are dictated by the nozzles, which in the experiments was a 280 µm nozzle that produced liquid metal lines having widths of about 250 µm. The uniform traces can be seen with strong adhesion between the liquid metal lines and the substrates.

Figure 1C:
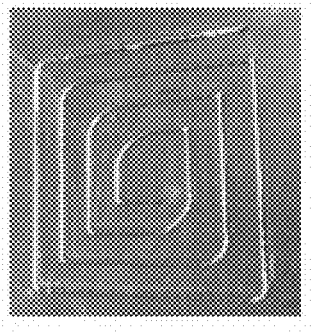
FIGS. 1A through 1C are images showing electrically conductive liquid metal patterns printed on different substrates in accordance with nonlimiting aspects of the present invention.
Figure 1E:
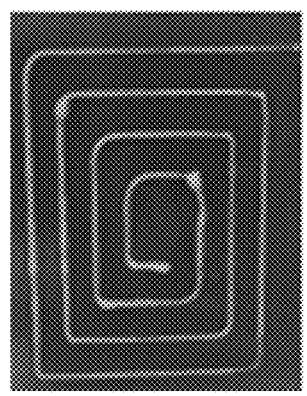
Figure 1B:
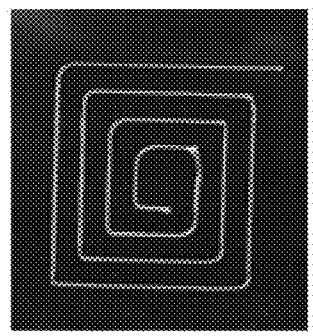
Figure 1D:
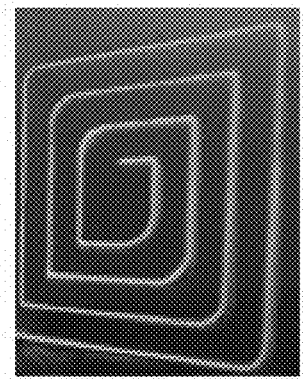
Figure 1A:
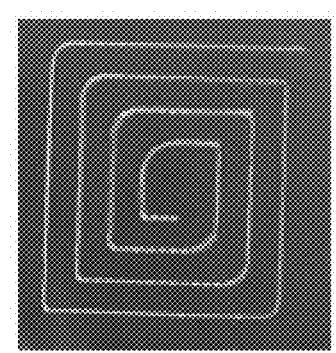

FIGS. 1D through 1F show the printed liquid metal patterns of FIGS. 1A through 1C, respectively, after the growth process of ZnO nanoplates that are described above. Referring to FIGS. 1 through 1F, it can be seen that the liquid metal patterns maintained the printed shape on their substrates after the growth process. The printed liquid metal patterns can serve as not only the bottom electrodes of electronic device but also reactive sites for nanomaterial growth. The color of the patterns changed from metallic sheen to white because of the existence of ZnO nanosheets on the surface of the liquid metal lines. The seed layer-free ZnO nanosheet growth showed very high selectivity which only grew on the surfaces of the liquid metal lines due to the higher surface energy of liquid metal. It is much easier for reactants to adhere to high surface energy material. In addition, the adsorbed ions underwent nucleation firstly while the other relative hydrophobic areas of the substrates remained blank Gallium also took part in the growth process, as discussed below. The great stability and selectivity of the liquid metal lines during the ZnO growth process made the approach promising for use in a liquid-solid heterojunction device.

Figure 2A:
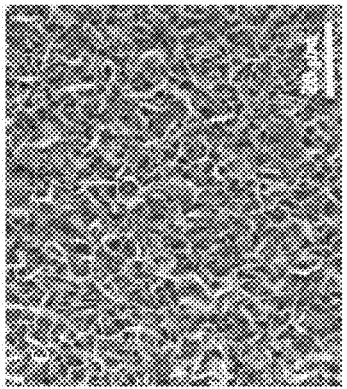
FIG. 2A is an image showing a cross-sectional SEM image of ZnO nanoplates on a liquid metal after being subjected to a growth process.
Figure 2B:
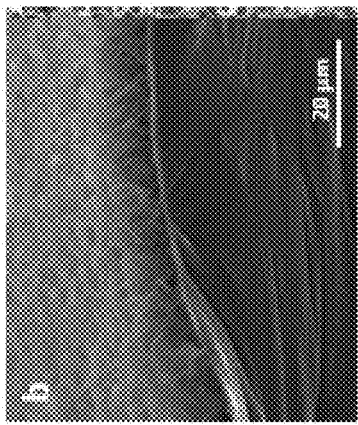
FIG. 2B is a high-magnification SEM image showing the position indicated within the box in FIG. 2A.
Figure 2C:
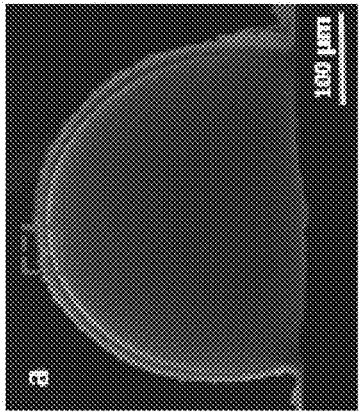
FIG. 2C is a top-view SEM image of ZnO nanoplates grown on a liquid metal.

In further experiments leading to this disclosure, ZnO nanoplate networks were synthesized through a seed-free aqueous solution method at low temperatures. Briefly, 15 mM $Zn(NO_3)_2$ was dispersed in 300 mL distilled water, after which 15 mM hexamethylenetetramine was added. The substrates, on which the liquid metal patterns were printed in advance, were dipped into the precursor solution and then held at 75° C. for 6 hours. After cooling to room temperature, the liquid metal patterns were twice washed carefully with ethanol and then deionized water. ZnO nanoplates were then grown on the surfaces of the liquid metal patterns. The morphology of the as-synthesized liquid metal/ZnO nanosheet heterojunction was characterized by scanning electron microscopy (SEM). The sectional view image (FIG. 2A) shows the ZnO nanosheet networks covering the entire surface of the liquid metal line. The diameter of the liquid metal line that can be seen in the side view image is about 250 µm, corresponding to the diameter of the printing nozzle, which suggested that there was no change or damage to the interior of the liquid metal lines during the growth process. The position indicated by the box in FIG. 2A is enlarged in FIG. 2B. The wrinkled sectional surface indicates certain fluidity of the underlying liquid eutectic GaIn. As can be seen in the top-view SEM image of FIG. 2C, vertically standing ZnO nanosheets were uniformly distributed on the surface of the liquid metal line and connected with each other to form nanosheet networks. The lateral sizes of the ZnO nanosheets was in the range of about 5 to 6 µm with a typical thickness of 15 nm. According to the EDX elemental mapping images (FIG. 2G) of zinc, indium and gallium of the cross-sectional liquid-solid heterojunction, there were a few gallium atoms distributed in the ZnO nanosheets while most gallium was concentrated within the liquid metal line with indium. Thus, the structure was proved to have realized the monolithic integration through the hybrid manufacturing of self-assembled inorganic semiconductor nanostructures on additively manufactured liquid electrodes, offering a new platform as a stretchable self-powered interface for further applications. A transmission electron microscope (TEM) image (FIG. 2D) was also taken verifying the nanosheet morphology of the product. The corresponding selective area electron diffraction (SAED) showed six independent diffraction spots, suggesting a highly crystalline hexagonal lattice of wurtzite structure. Interplanar spacing of 0.28 nm can be observed from the high-resolution transmission electron microscopy (HRTEM) image of FIG. 2E, which is consistent with the d spacing of (100) planes of hexagonal ZnO, further confirming the chemical component.

In order to investigate the existence of gallium and its state in the ZnO nanosheets, X-ray photoelectron spectroscopy (XPS) was carried out. The typical XPS survey scanning is shown in FIG. 2H. The peaks of zinc, gallium, oxygen and carbon can all be detected and identified, indicating the existence of these elements on the surface of the ZnO nanosheets. In FIG. 2I, the high-resolution XPS spectrum of the Zn $2p_{3/2}$ core level was divided into two peaks by fitting with Gaussian function. The dominant peak at 1021.4 eV corresponds to the binding energy of $Zn^{2+}$ in ZnO, proving again the chemical component of the nanosheets. The weaker peak at 1022.9 eV may be attributed to some zinc hydroxide species. The symmetric peak of Ga $2p_{3/2}$ in FIG. 2J was centered at 1117.6 eV, indicating that the gallium atoms within the nanosheets are in a compound state instead of elemental state. It is likely that gallium complex ions remain on the surface of ZnO. However, the ion formation and location need further study. FIG. 2K displays the XPS spectrum of O 1s which is composed of two peaks. The main peak located at 529.9 eV is associated with the oxygen in the ZnO wurtzite structure. The shoulder peak at 532.2 eV likely comes from the hydroxyl group, which may be related to the zinc hydroxide species, or chemisorbed oxygen species (C—O, C═O) on the surface of the ZnO nanosheets. The above XPS results confirm the existent of gallium compounds on the surface of the ZnO nanosheets.

Figure 2F:
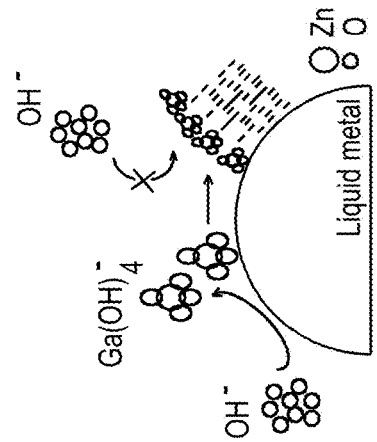
FIG. 2F schematically represents a Ga-assisted ZnO nanoplate growth mechanism.
Figure 2E:
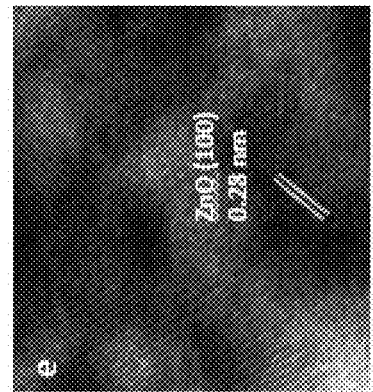
FIG. 2E is an HRTEM image of a ZnO nanoplate.
Figure 2D:
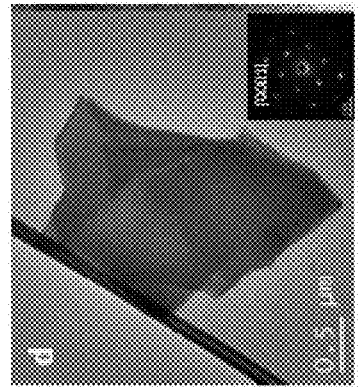
FIG. 2D is a typical TEM image of ZnO nanoplates (inset is an SAED pattern corresponding to the image).
Figure 2G:
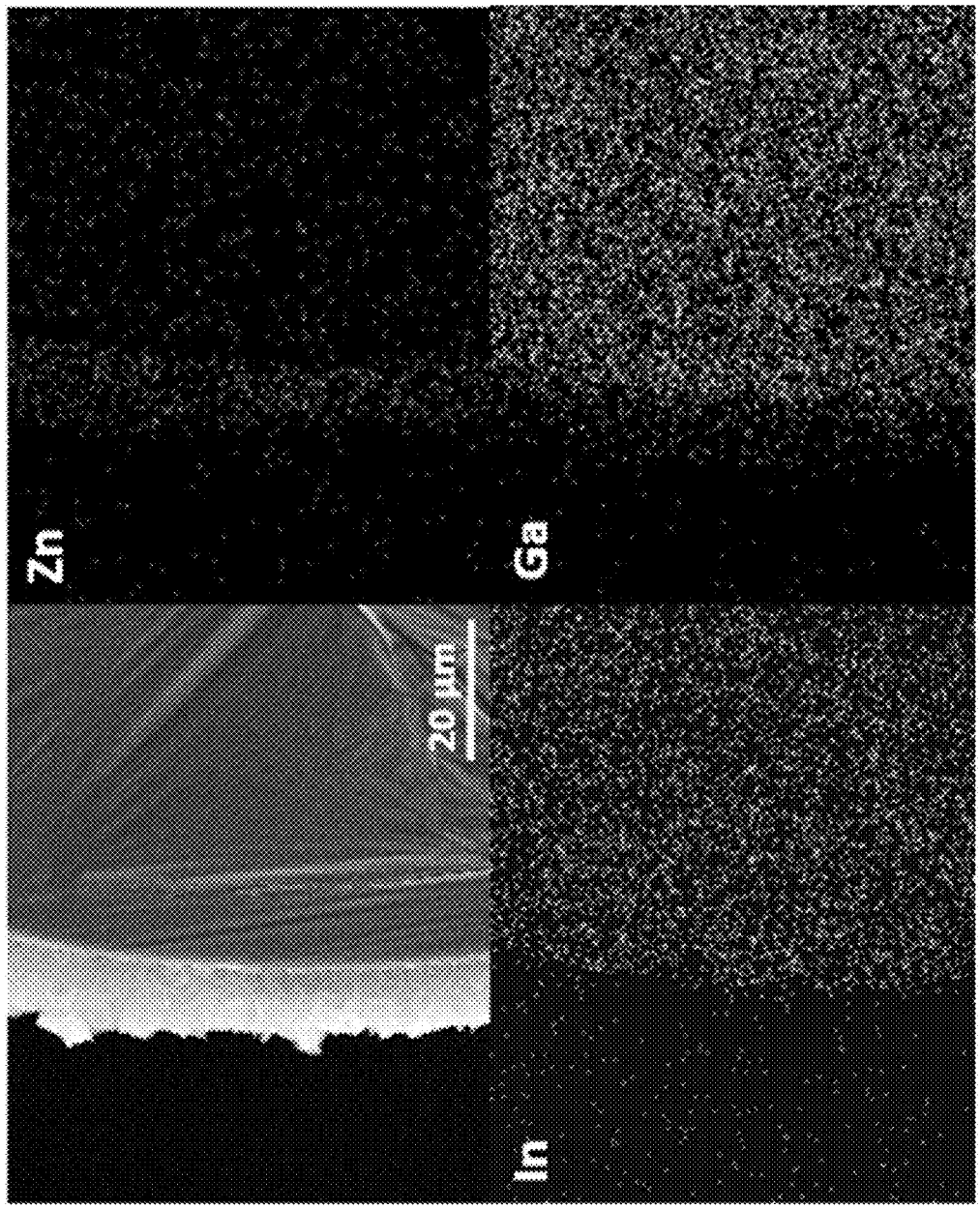
FIG. 2G shows an SEM image of a cross-section of a liquid metal/ZnO nanosheet heterojunction and corresponding EDX elemental mapping images for zinc, indium and gallium of the heterojunction. Indium and gallium are evenly distributed within the liquid metal while zinc has a uniform distribution within the surface layers of the ZnO nanosheet. Gallium appears within the surface layer of ZnO, but indium does not, suggesting that gallium took part in a growth process of the ZnO nanoplates.
Figure 2H:
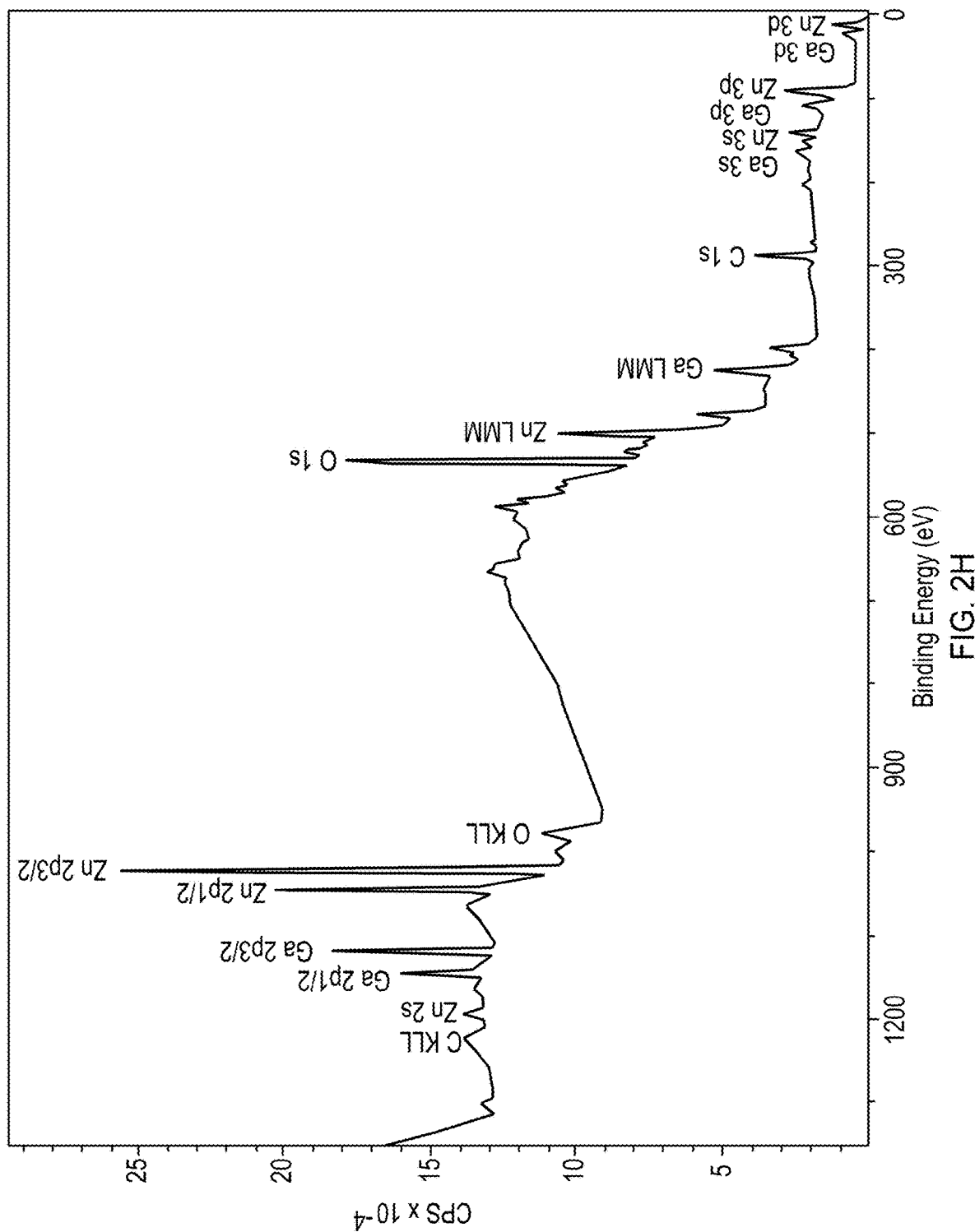
Figure 21:
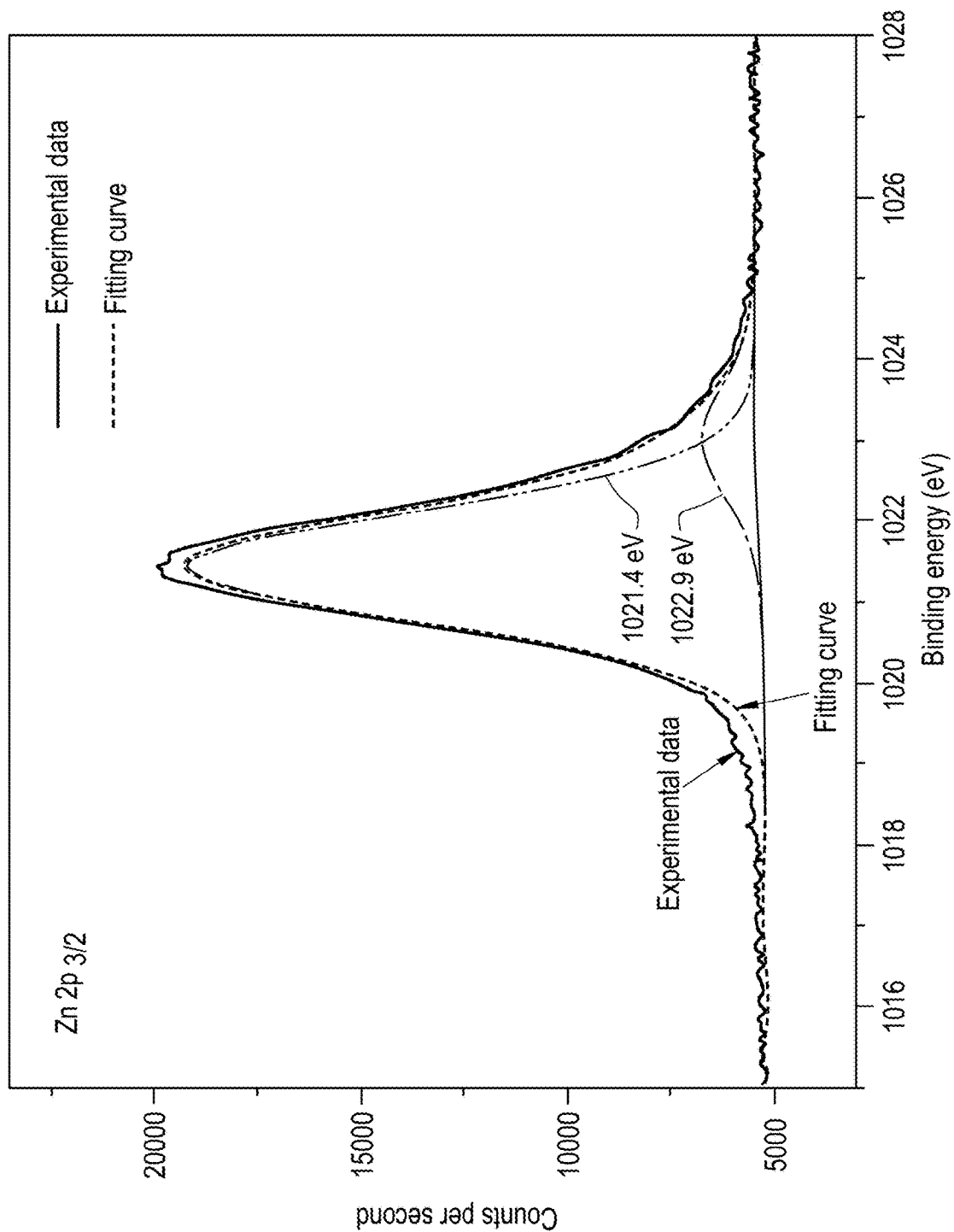
Figure 2J:
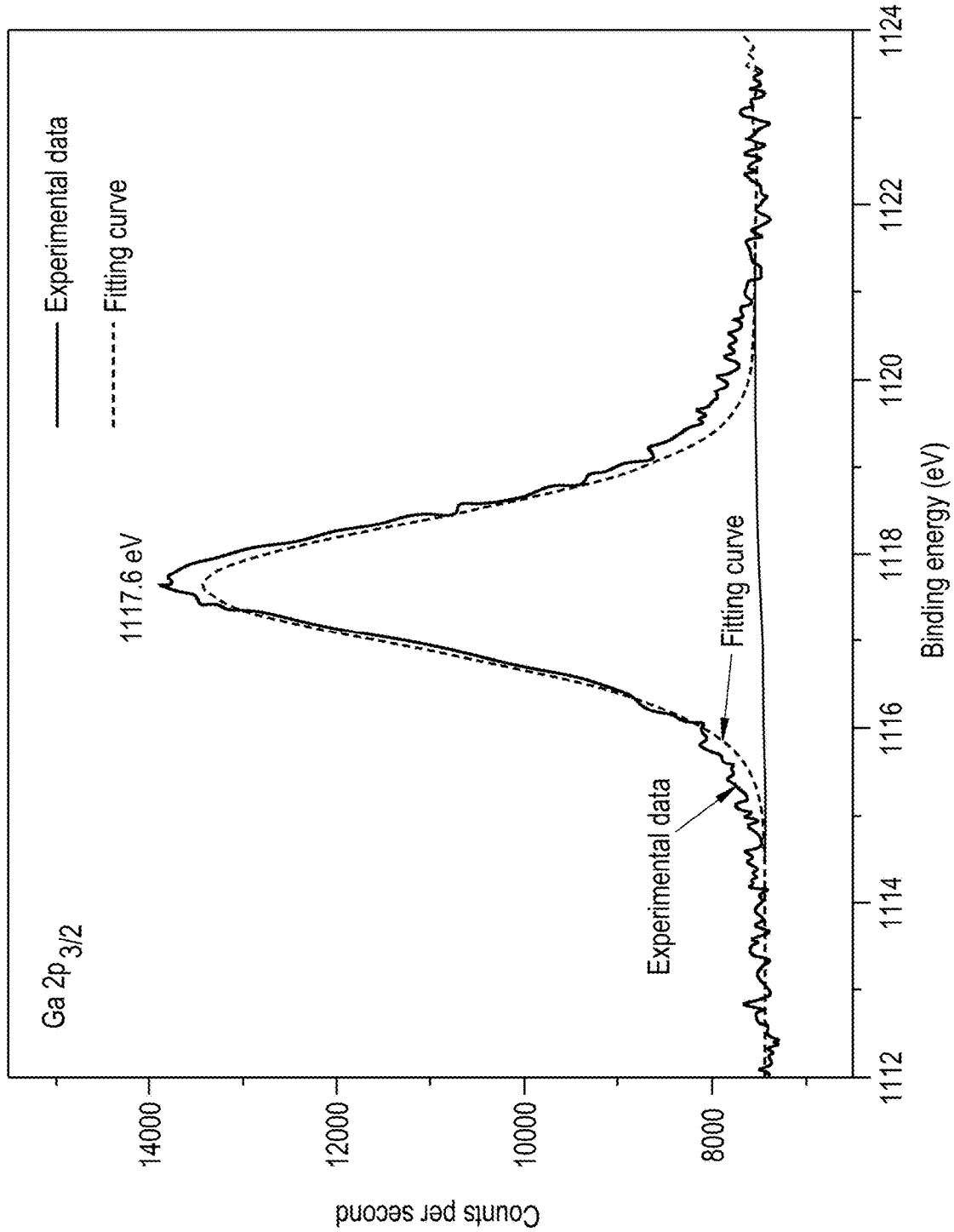
Figure 2K:
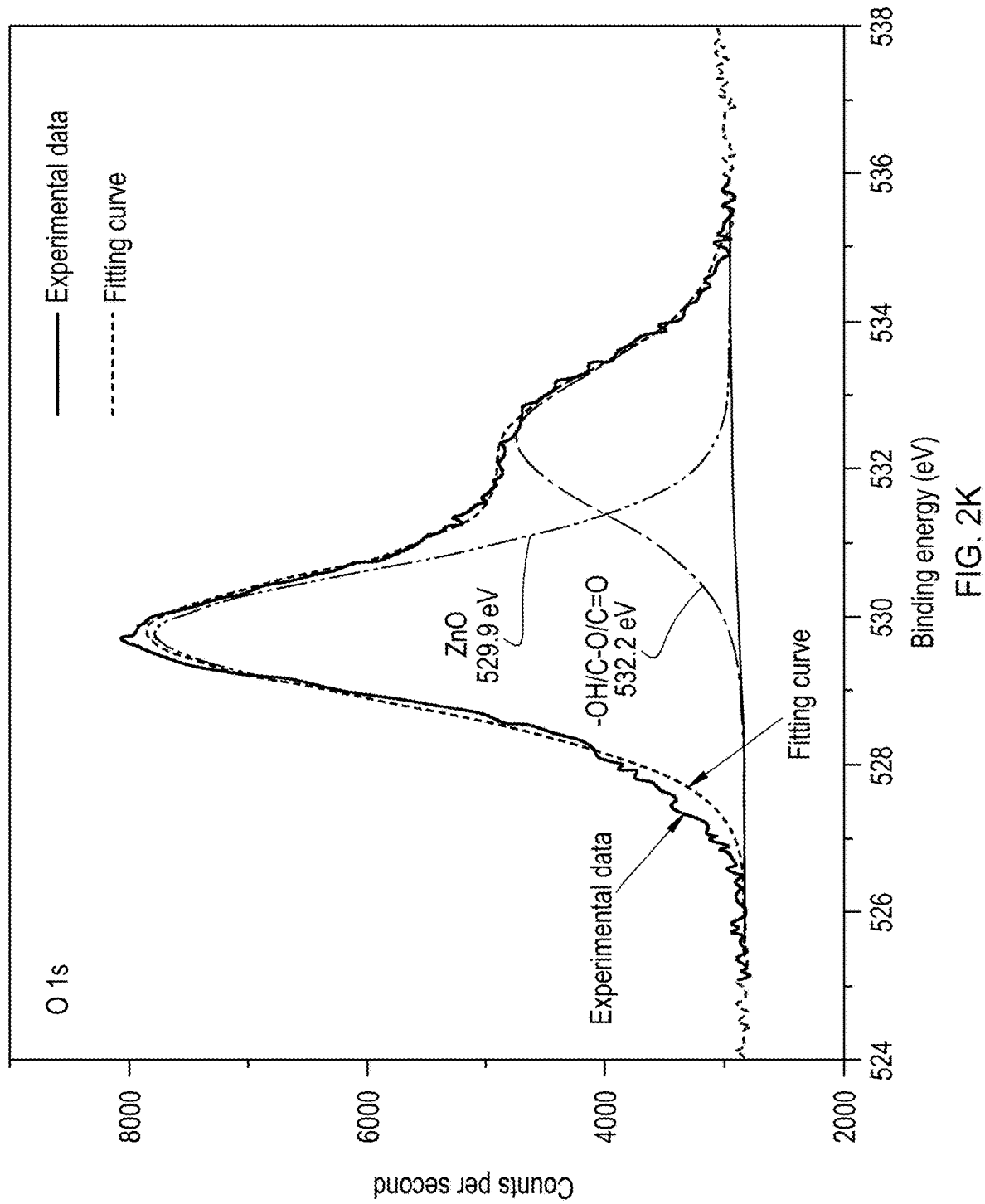

The Ga-assisted formation mechanism of ZnO nanosheets is schematically represented in FIG. 2F. Under the same growth conditions on bare substrates with a ZnO seed layer, vertically aligned ZnO nanowires are obtained without gallium, evidencing the effect of gallium during the ZnO nanosheet growth process. The liquid metal surface exposed to air was dominated by gallium oxide, while indium was limited to locations within the liquid metal lines and did not participate in the reaction. This may be due to indium being permeable to oxygen and oxygen reacting with gallium, and then the oxidized gallium displacing indium at the surfaces of the liquid metal lines. The (0001)-Zn terminated positively polar surfaces are chemically reactive, so that with the presence of hexamethylenetetramine (HMTA), prior absorption of $OH^-$ ions to (0001) plane determined the crystal growth along the c-axis. Preferential anisotropy growth of ZnO along the c-axis is energetically favorable, which results in the formation of 1D nanostructures. In order to inhibit the growth in an intrinsic direction, a blocking agent, in this case, $Ga(OH)_4^-$, was possibly at work, which formed from the reaction between $OH^-$ and the liquid metal, similar to the reaction of aluminum in the same elemental group. The blocking agent may bind to the positively charged (0001)-Zn terminated facets, blocking the growth along [0001] direction while leaving the nonpolar sidewalls still exposed in solution for further growth, which allows the formation of 2D nanosheets whose polarized direction is parallel to the substrate. The steric effect of growing a ZnO nanosheet network also prevented the ion absorption between lateral surfaces, contributing to the observed thickness confinement. This strategy is similar to an organic additive capping method. Different from the other ion-dopants dispersed in solution, the as-printed gallium source was localized on the substrates as patterns, resulting in a very high local concentration of $Ga(OH)_4^-$, which is more efficient for controlling growth. It is worth to point out that the control of the nanostructure growth direction may have a significant impact on tuning orientation-dependent properties such as thermal, optical and electronic performances.

Figure 3A:
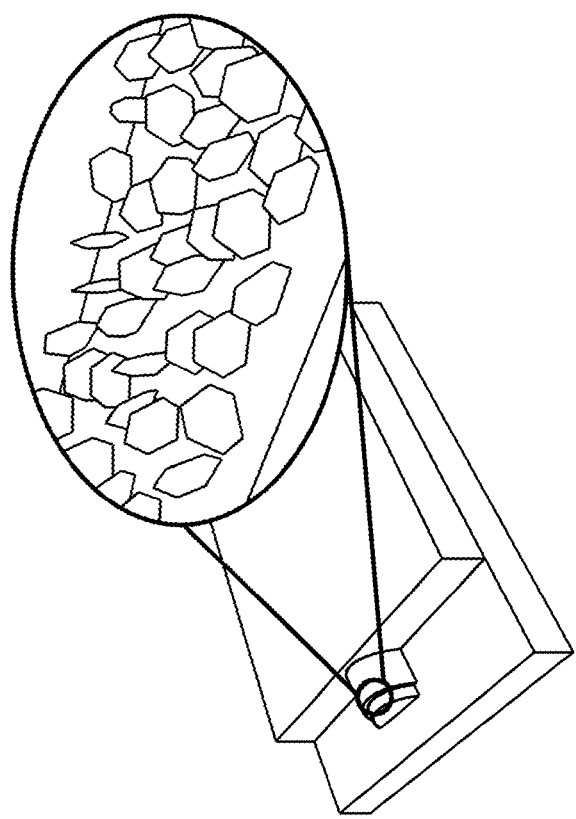
FIG. 3A schematically represents a piezoelectric electronic device comprising a heterostructure utilizing a liquid metal and nanostructures that form a liquid-solid heterojunction with the liquid metal.
Figure 3D:
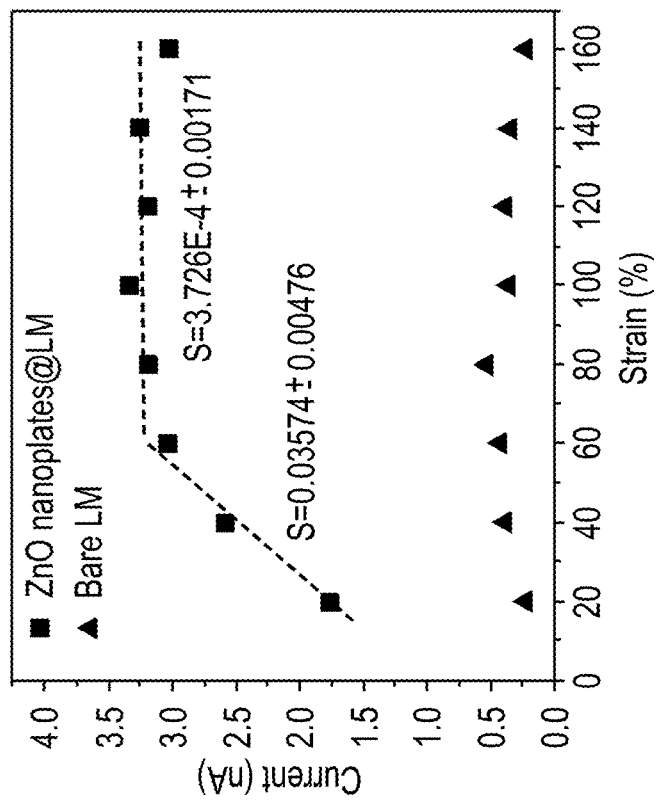
FIGS. 3C and 3D show voltage and current curves respectively, generated with different strains imposed on a ZnO nanoplate directly grown on a liquid metal (@LM) electrode, and compared with signals generated with different strains imposed on a bare liquid metal (LM) line.
Figure 3C:
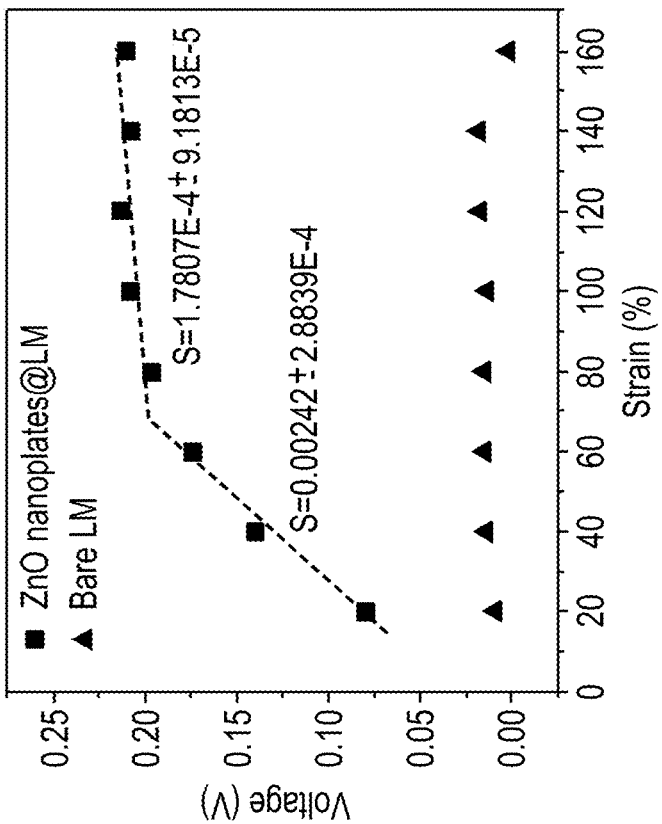
Figure 3F:
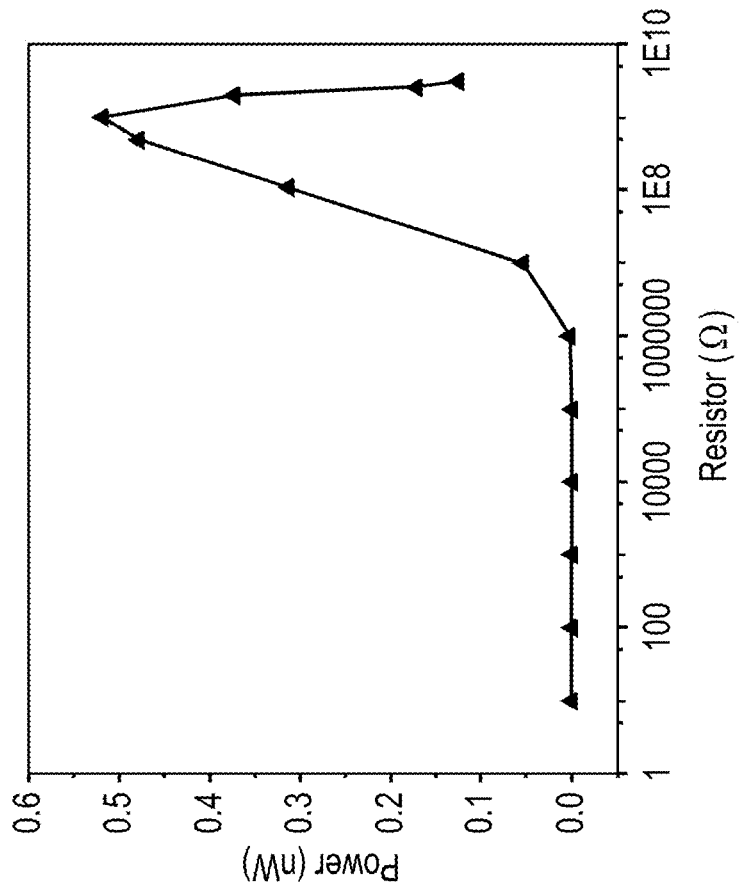
FIG. 3F shows the dependence of output power on the resistance of an external load when a piezoelectric device comprising a liquid-solid heterojunction is subject to an 80% strain.
Figure 3E:
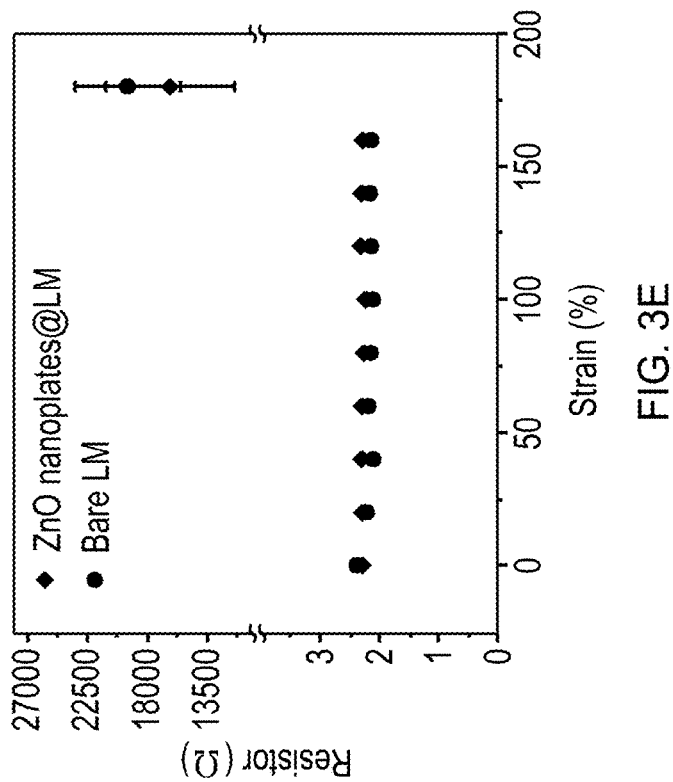
FIG. 3E shows resistance changes that occur during stretching of a piezoelectric device comprising a liquid metal electrode formed by a liquid metal and nanostructures that form a liquid-solid heterojunction with the liquid metal.

The as-fabricated liquid-solid heterojunction was encapsulated in a stretchable polymer substrate, in this case a silicone-based elastomer material commercially available from Smooth-On, Inc., under the name ECOFLEX™, as a thin film with high sensitivity of mechanical stimuli and useful for applications in self-powered smart skin and health monitoring. FIG. 3A schematically represents a piezoelectric electronic device comprising a heterostructure utilizing a liquid-solid heterojunction within the scope of the invention. The continuous liquid metal line served as a bottom electrode directly contacting a functional layer formed by the ZnO nanosheet network. Since the c-axis lies vertically to the lateral (0001) plane, the charges generated by the deformation of the ZnO nanosheets were opposite for the front side and back side. The piezoelectric polarization distribution and the piezo-potential surface distribution were simulated by using the COMSOL Multiphysics® simulation software in FIG. 3B. The hexagonal shapes of the ZnO nanosheets were set up with a grounded bottom surface which electrically connected with the liquid metal. The ZnO nanosheets were compressed and bended. It can be seen that the generated potential is located between the two lateral surfaces. The linked piezo-potential forms an electrical field that drives electrons transfer inside the liquid metal electrode. The relationship between the output signals and applied strain was then investigated. According to FIGS. 3C and 3D, it is clear that the signal intensities, for both voltage and current, for liquid metal lines with ZnO nanostructures increase with higher strain, while for bare liquid metal lines without ZnO nanostructures, the signals remain constant and low no matter how large the strain is. The pressure sensitivity S is defined as the slope of the traces. There is a reduction of sensitivity for strains above 80% as the ZnO nanosheets were highly compressed, requiring higher strain to further deform the nanosheets. The resistance of the device was unchanged under 160% strain, indicating an appreciable degree of stretchability, but dramatically increased when strain was outside this range because of the poor metallic continuity within the electrode (FIG. 3E). The dependence of output power on the resistance of external load was measured at 80% strain. In FIG. 3F, the optimized output power appears with 1 G$\Omega$ external load.

Figure 4A:
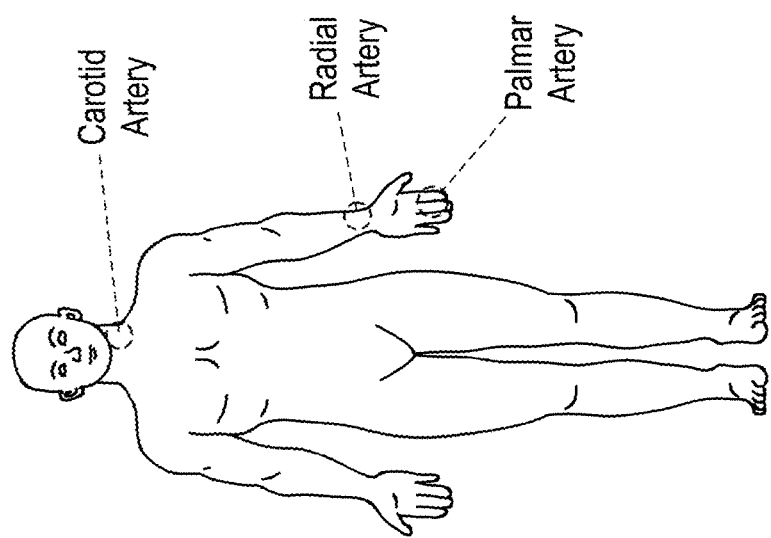
FIG. 4A represents exemplary locations for stretchable wearable devices to detect pulse at the neck (carotid artery), wrist (radial artery) and finger (palmar artery) of a human.
Figure 4B:
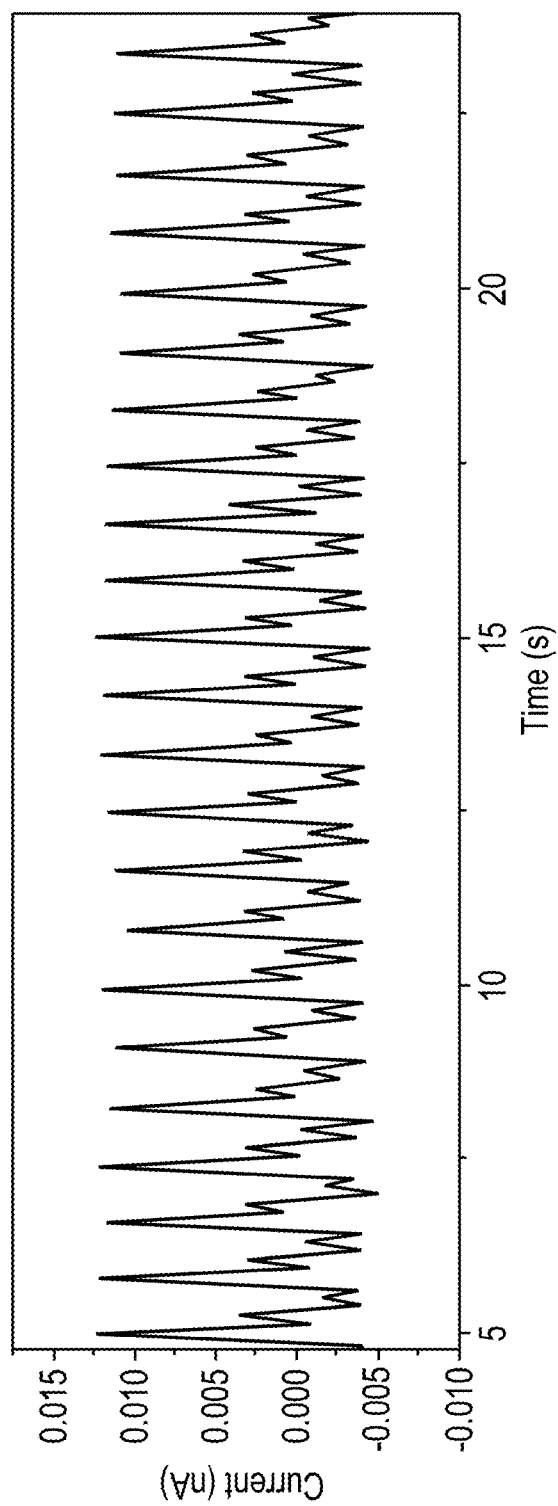
FIG. 4B shows real-time transient signals of a radial artery.
Figure 4C:
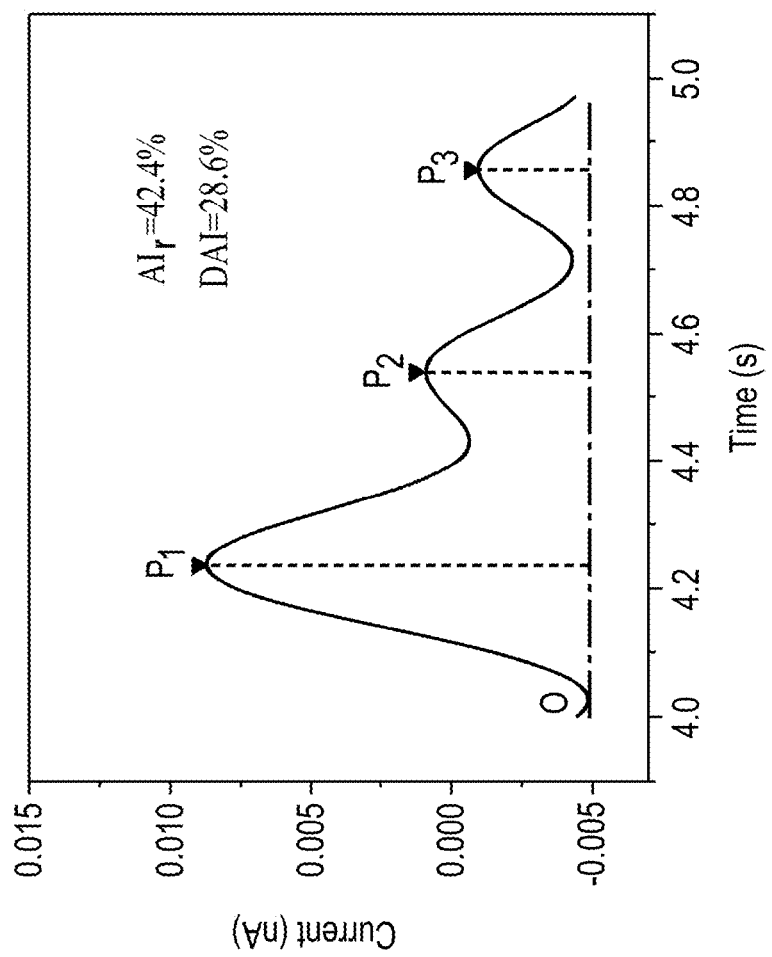
FIG. 4C shows current generated by a piezoelectric device in response to one radial artery pulse period.

As a demonstration of its high sensitivity and wearability, electronic devices fabricated above were directly and conformally attached to a human body for non-invasive pulse detection without either tape or a power source (e.g., battery), which are usually required by previous wearable electronic sensing devices. FIG. 4A is an image schematically representing exemplary locations where such devices were applied during investigations leading to the invention. One particular location is the wrist, to which a device was applied to a healthy 23-year-old male so as to be located above the radial artery corresponding to a known testing site for arterial tonometry. The real-time electrical outputs of several pulse periods from the device were recorded and are shown in FIG. 4B. It can be seen that the characteristic pulse wave shapes contain three clearly distinguishable peaks with consistent intensities and time intervals corresponding to the cardiac cycle. One of the pulse periods was magnified in FIG. 4C to analyze the details and obtain useful information for health diagnostics. Point O is the starting point of a pulse period, which is the lowest point in the waveform, indicating the position of a baseline. The first peak ($P_1$) is the main wave caused by rapid expansion of the arterial wall, which is the result of incoming blood ejected by the left ventricle. The rising time and amplitude reflect the elasticity and expandability of the vessel walls, which varies for arteries at different sites of a human. As the ventricle blood pressure decreases, the reverse reflected wave from the lower body forms a superposition peak ($P_2$) with incoming blood wave, referred to as a tidal wave. The time delay between the first and second peaks, $\Delta T_{DVP}=t_{(P1)}-t_{(P2)}$, and the radial augmentation index, $AI_r=P_2/P_1$, are two of the most commonly used parameters for arterial stiffness diagnosis. Subsequently, the ventricle being diastolic and aortic valve closed, the blood bouncing off the closed aortic valve forms the last peak ($P_3$) which is a dicrotic wave. The radial diastolic augmentation index, $DAI=P_3/P_1$, can also be used for quantitative evaluation of arterial stiffness. The average values (from thirty pulse waves) of $AI_r$ and DAI under normal conditions was 0.46 and 0.25, respectively, which are consistent with the data from the literature of healthy adult males at about 25 years of age. The heart rate was about 65 beats per minute with the time delay ($\Delta T_{DVP}$) of 250 ms. The relatively long reflected wave transmission time suggested good flexibility of the individual's blood vessels.

Figure 4E:
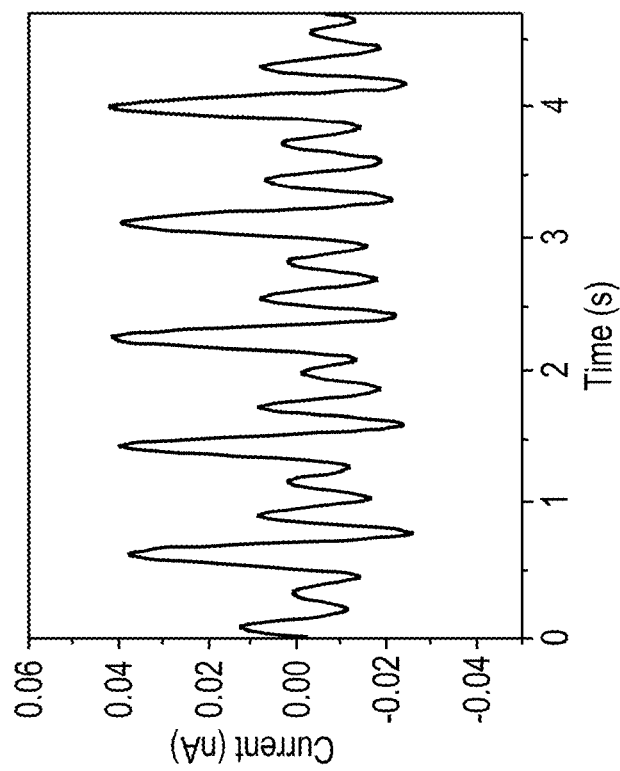
FIGS. 4D and 4E show real-time transient signals generated by piezoelectric devices at the radial artery, carotid artery and palmar artery, respectively, [ONLY TWO ARE SHOWN] for the pulse waveform shown in FIG. 4C containing three peaks.
Figure 4D:
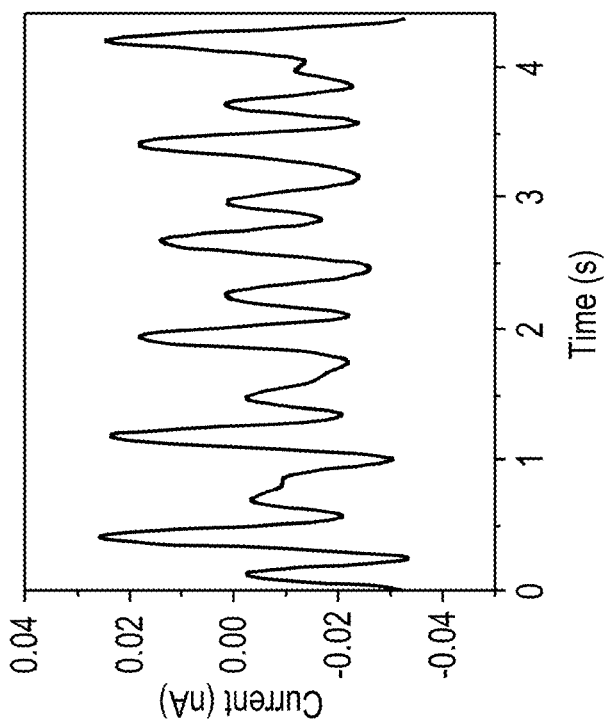

Further taking advantage of the soft, thin, and small devices, FIG. 4A indicates that electronic devices as described herein can be placed on the human finger and neck to record pulse waves from different anatomical sites. FIGS. 4D and 4E indicate that waveforms observed from the finger (FIG. 4D) were similar to that of the wrist (FIG. 4A), while the pulse waves collected from the carotid artery (FIG. 4E) lack the second peaks ($P_2$). This phenomenon can be attributed to the fact that the finger and wrist are closer to vascular ends, which tend to make the collected waveforms easily influenced by reflected waves from the upper limb, whereas these reflected waves are difficult to observe on the carotid artery. In addition, the blood vessels distributed within the fingertip are capillary arteries which are thinner but have a higher transmission speed compared with the radial and carotid arteries, which belong to aorta branches. The slopes of $P_1$ from the wrist and neck were about 0.09 nA/s while that from the fingertip was about 0.31 nA/s, agreeing well with the analysis above.

Figure 4F:
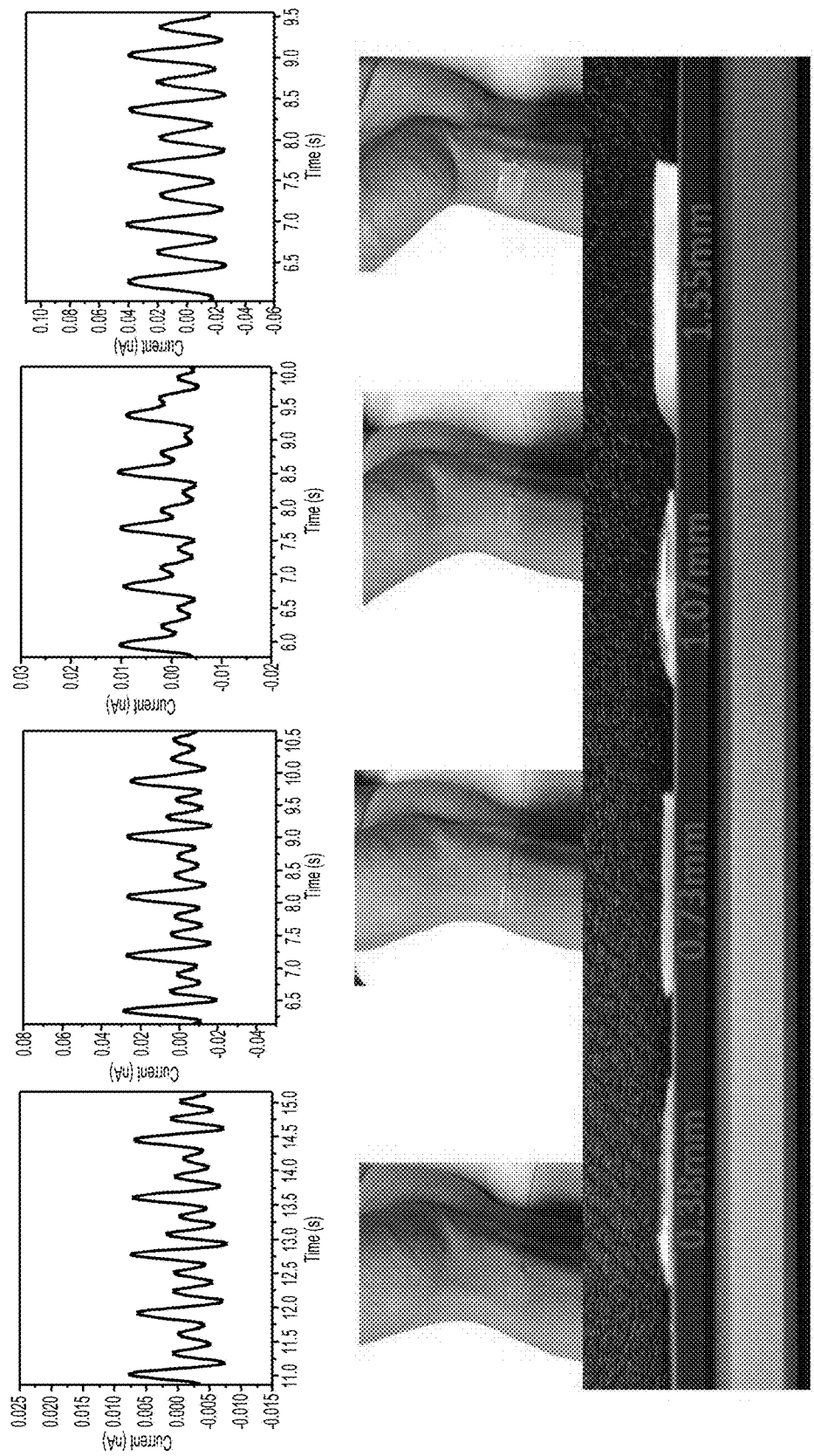
FIG. 4F schematically represents four piezoelectric device of different thicknesses (0.38 mm, 0.73 mm, 1.07 mm, and 1.55 mm), and illustrate the dependency of the adhesion and sensitivity of the devices on device thickness.

The adhesive property and working sensitivity of the electronic devices described herein were shown to depend on the thicknesses of the devices (FIG. 4F). On the one hand, a thinner device has a relatively better adhesive ability. However, the performance of the thinnest device evaluated was compromised by vibrations generated from the arteries, which tended to influence the physical stability of the device. On the other hand, the sensitivity of the thickest evaluated device to vibrations from the arteries was compromised due to the device thickness. From the investigations, it appeared that devices with a thickness of about 1 mm exhibited an optimal performance.

Compared to existing technologies, the liquid-solid heterojunction device of the wearable devices described above showed much higher sensitivity by being able to detect imperceptible background information, such as inhalation/exhalation. The wearable devices were much more stretchable compared to biological human skin, due in part to the advantages of the mechanical and electrical properties of an electrode formed of a liquid metal pattern. The self-powered electronic devices were concluded to sustainably perform non-invasive physiological functions by harvesting the operation power from the human body.

Based on the above description, it can be seen that a versatile platform for the monolithic integration of liquid-solid heterojunction devices has been established through the hybrid manufacturing of self-assembled 2D piezoelectric nanostructures on additively manufactured liquid electrodes. The printed liquid metal lines assisted in controlling the growth of the 2D ZnO nanosheets without any damage of the interiors of the liquid metal lines (electrodes). The fabricated devices showed good stretchability and maintained low resistance under 160% strain. The high sensitivity and wearability enabled the use of the liquid-solid heterojunction electronic device as self-powered sensors for non-invasive pulse detection. A new class of wearable electronic devices based on this liquid-solid heterostructure can be expected to be achievable with other nanomaterials.

While the invention has been described in terms of particular embodiments and investigations, it should be apparent that alternatives could be adopted by one skilled in the art. For example, the devices and their components could differ in appearance and construction from the embodiments described herein and shown in the drawings, process parameters could be modified, and appropriate materials could be substituted for those noted. As such, it should be understood that the above detailed description is intended to describe the particular embodiments and certain but not necessarily all features and aspects thereof, and to identify certain but not necessarily all alternatives to the embodiments and their described features and aspects. As a nonlimiting example, the invention encompasses additional or alternative embodiments in which one or more features or aspects of a particular embodiment could be eliminated or two or more features or aspects of different embodiments could be combined. Accordingly, it should be understood that the invention is not necessarily limited to any embodiment described herein or illustrated in the drawings, and the phraseology and terminology employed above are for the purpose of describing the disclosed embodiments and investigations and do not necessarily serve as limitations to the scope of the invention. Therefore, the scope of the invention is to be limited only by the following claims.

The invention claimed is:

1. A deformable heterostructure comprising a stretchable substrate that stretches and deforms when subjected to mechanical strain of at least 20%, a conductive liquid metal on the substrate wherein the conductive liquid metal is a liquid at room temperature, and nanostructures forming a solid-liquid heterojunction with the conductive liquid metal.

2. The deformable heterostructure of claim 1, wherein the deformable heterostructure is a component of a piezoelectronic device.

3. The deformable heterostructure of claim 1, wherein the conductive liquid metal is a eutectic alloy of gallium and indium.

4. The deformable heterostructure of claim 1, wherein the nanostructures are a piezoelectric material.

5. The deformable heterostructure of claim 4, wherein the piezoelectric material is ZnO.

6. The deformable heterostructure of claim 1, wherein the nanostructures are two-dimensional nanosheets.

7. The deformable heterostructure of claim 6, wherein the nanostructures have lateral dimensions in a size range of 1 nanometer to 100 micrometers.

8. An electronic device comprising:
a stretchable substrate that stretches and deforms when subjected to mechanical strain;
a conductive liquid electrode on the substrate wherein the conductive liquid metal is a liquid at room temperature; and
a sensing element comprising a piezoelectric material on the conductive liquid electrode forming a solid-liquid heterojunction between the piezoelectric material and the conductive liquid electrode, wherein a charge differential is created in the piezoelectric material in response to a mechanical strain.

9. The electronic device of claim 8, wherein the substrate is stretchable to at least a strain of 20%.

10. The electronic device of claim 8, wherein the electronic device is wearable by a human being.

11. The electronic device of claim 8, wherein the conductive liquid electrode comprises a eutectic alloy of gallium and indium.

12. The electronic device of claim 8, wherein the piezoelectric material comprises nanostructures.

13. The electronic device of claim 12, wherein the nanostructures are two-dimensional nanosheets.

14. The electronic device of claim 13, wherein the nanostructures have lateral dimensions in a size range of 1 nanometer to 100 micrometers.

15. The electronic device of claim 8, wherein the piezoelectric material is ZnO.

* * * * *